(12) United States Patent
Chang et al.

(10) Patent No.: US 8,570,727 B2
(45) Date of Patent: Oct. 29, 2013

(54) BACK PANEL FOR VIDEO DISPLAY DEVICE

(75) Inventors: Darwin Chang, Orange, CA (US);
Hong S. Ting, Orange, CA (US); John Araki, Orange, CA (US)

(73) Assignee: Westinghouse Digital, LLC, Orange, CA (US)

( * ) Notice: Subject to any disclaimer, the term of this patent is extended or adjusted under 35 U.S.C. 154(b) by 104 days.

(21) Appl. No.: 13/169,230

(22) Filed: Jun. 27, 2011

(65) Prior Publication Data

US 2011/0249388 A1 Oct. 13, 2011

Related U.S. Application Data

(63) Continuation of application No. 11/426,254, filed on Oct. 4, 2006, now Pat. No. 7,969,719.

(60) Provisional application No. 60/756,169, filed on Jan. 4, 2006.

(51) Int. Cl.
*H05K 5/00* (2006.01)
*H05K 7/00* (2006.01)
*G06F 1/16* (2006.01)

(52) U.S. Cl.
USPC .............................. 361/679.21; 361/679.22

(58) Field of Classification Search
USPC ...................................... 361/679.21, 679.22
See application file for complete search history.

(56) References Cited

U.S. PATENT DOCUMENTS

| | | | |
|---|---|---|---|
| 5,257,163 A * | 10/1993 | Buist et al. | 361/679.32 |
| 5,818,689 A | 10/1998 | Johns et al. | |
| 6,104,451 A | 8/2000 | Matsuoka et al. | |
| 6,188,569 B1 | 2/2001 | Minemoto et al. | |
| 6,507,352 B1 * | 1/2003 | Cohen et al. | 715/817 |
| 6,807,051 B2 * | 10/2004 | Takahashi | 361/679.23 |
| 7,064,672 B2 * | 6/2006 | Gothard | 340/815.4 |
| 7,091,665 B2 * | 8/2006 | Nomoto et al. | 313/583 |
| 7,245,481 B2 * | 7/2007 | Shimizu et al. | 361/679.08 |
| 7,267,315 B2 | 9/2007 | Chen | |
| 7,397,659 B1 * | 7/2008 | Curran et al. | 361/679.41 |
| 7,450,372 B2 * | 11/2008 | Lin et al. | 361/679.55 |
| 7,542,283 B1 * | 6/2009 | Curran et al. | 361/679.41 |
| 7,864,515 B2 * | 1/2011 | Numata et al. | 361/679.21 |
| 7,969,719 B2 | 6/2011 | Chang et al. | |
| 2005/0185365 A1 * | 8/2005 | Yamaguchi et al. | 361/679 |
| 2006/0164325 A1 | 7/2006 | Ford et al. | |
| 2007/0097608 A1 * | 5/2007 | Matsutani et al. | 361/681 |
| 2007/0103863 A1 * | 5/2007 | Kim | 361/687 |
| 2007/0133158 A1 | 6/2007 | Oda et al. | |
| 2007/0153454 A1 | 7/2007 | Chang et al. | |
| 2008/0186664 A1 | 8/2008 | Chang et al. | |

* cited by examiner

*Primary Examiner* — Anthony Haughton
(74) *Attorney, Agent, or Firm* — Renner, Otto, Boisselle & Sklar, LLP

(57) ABSTRACT

A back panel for a display device, such as a flat-panel television or computer monitor, which is very thin around the edges and houses all electronics in a "spine" near the vertical center of the back of the display. The back panel provides novel heat-dissipation, arrangement of electronics to save space, forces the center of gravity forward allowing the display to be set closer to a wall, and provides less interference and signal degradation than the prior art.

22 Claims, 5 Drawing Sheets

BACK PANEL FOR VIDEO DISPLAY DEVICE

This application is a continuation of pending U.S. application Ser. No. 11/426,254, filed Oct. 4, 2006, which claims priority to U.S. Provisional Application No. 60/756,169, filed Jan. 4, 2006. Both of the above applications are incorporated herein by reference in their entireties.

BACKGROUND

1. Field of the Invention

The present invention relates to televisions and more particularly to an improved back center panel for video display device. The invention is a thin centrally-mounted back solution for a flat panel display that houses all electronics and connectors for the display. The central solution also contains the main controller board for the display and the power supply.

2. Background of the Invention

Televisions have evolved from black and white, to color, and most recently into flat panels and high definition televisions. Through this process, the technology used to perform the various functions has progressed from clunky to refined. In particular, flat panel displays have become very popular due to the low space requirement, the possibility of wall-mounted units, and the availability of digital-quality picture.

In the prior art, flat panel displays have often been approximately 3-5 inches thick, a considerable improvement over the prior art, but in virtually every embodiment this thickness covers the entirety of the back of the flat panel display. In many cases the effective thickness of the display is further increased due to poor cable management. This thickness is typically used throughout the display to enable the display's control or logic boards to dissipate heat at functional levels and in order that the display may be uniform thickness throughout for aesthetic purposes. Additionally, electronics and input and output connections to the display are typically embedded throughout the back of the display in the prior art, necessitating the use of a uniform thickness throughout. A great deal of wiring is used, when mass produced, to connect all of these disparate electronic components and input and output connectors within the back of a display in the prior art. The addition of these longer signal paths and corresponding connectors introduces visible and unnecessary electronic signal degradation and interference. Additionally, the electronic components' scattered positions throughout the back of the display increase the manufacturing cost of wiring the components together.

BRIEF SUMMARY OF THE INVENTION

The present invention is a flat panel display that provides all input and output connections, the main logic board, the power supply and the connections to the display within a small rectangular area, similar to a human spine, in the center-back of a flat panel display. Other elements of the display attach to or are housed within this spine reducing cost and weight, and this allows for more efficient manufacture as well as repair. The mount-points for wall mounting and other mounting options for flat panel displays are also included in the spine. The remaining area surrounding this "spine" on either side is very thin and very aesthetically pleasing. It also has the additional effect of making the unit lighter and smaller. The connectors, such as for a/c power and digital video in are on either side of the spine, rather than on the back or bottom so as to allow for easy wall-mounting or simply placing the display close to the wall. Additionally, the spine-side-mounted connections enable the user to more easily see and access the connections when the unit is wall-mounted or placed close to a wall.

It is therefore an object of the present invention to provide a back panel of a flat panel display that is aesthetically pleasing, thinner, lighter, easier to use, independent of display size, has flexible attach points for sub-components and which may be mounted closer to the wall due to the "spine" design than previous flat panel displays in the art. It is a further object of the present invention to provide a standardized single structure in multiple sizes of flat panel displays for use with the same wall and other mounting equipment. It is a further object of the present invention to provide a standardized single structure in multiple sizes of flat panel displays for use with the same base. It is a further object of the present invention to limit the depth away from the wall that the display is mounted. It is an additional object to enable standardization of internal power supply and reduced use of necessary shielding material for wires, as they are now only housed in the central spine.

It is a further object of the present invention to provide easy viewing and access to input, output and other connectors to the display, as they are now visible and accessible from the sides of the spine of the display. It is a further object of the present invention to allow cables to "waterfall" to the sides of the spine, not requiring additional space behind the display or out from the back of the display and further not "kinking" the cables for poor performance. It is a further object of the present invention to provide a single heatsink and logic board for use with multiple television displays, further saving in production costs due to standardization. These and other objects of the present invention will be seen in the following description of the invention.

A "bucket" or back housing for a flat panel television with thin center-mounted controller board and power supply is described. This back panel is an improvement on the prior art by allowing for the production of a thinner, lighter and cheaper to produce flat panel display overall. The bucket of the flat panel display has a centrally mounted "spine" in which all electronics, connectors, heat sink and the power supply are placed.

The flat panel display provides a very thin, front to back, screen area. The thickness required for the screen itself and the housing surrounding the screen are all that is necessary in the non-spine areas of the display. In the center of the display back, the main logic board and power supply are situated. The housing over this area also may be reinforced to allow the unit to be wall-mounted. The spine configuration of the display requires fewer separate components to be connected via wiring, requires less wiring to connect the components with the screen itself, and makes it such that the spine itself may be easily mass-produced and attached to multiple sizes and types of displays.

The components housed within the spine: the power supply, the logic board, the input and output connectors, the wall mounting brackets, the frame and display support rails, and other electronics and necessary components are all housed within a standardized spine which may be attached to numerous sizes of displays. The software within the logic board will be standardized to enable the logic board to operate any of the multiple displays to which is may be attached. Other features and advantages of the present invention will become apparent in the further description.

DETAILED DESCRIPTION OF THE INVENTION

Figure 1:
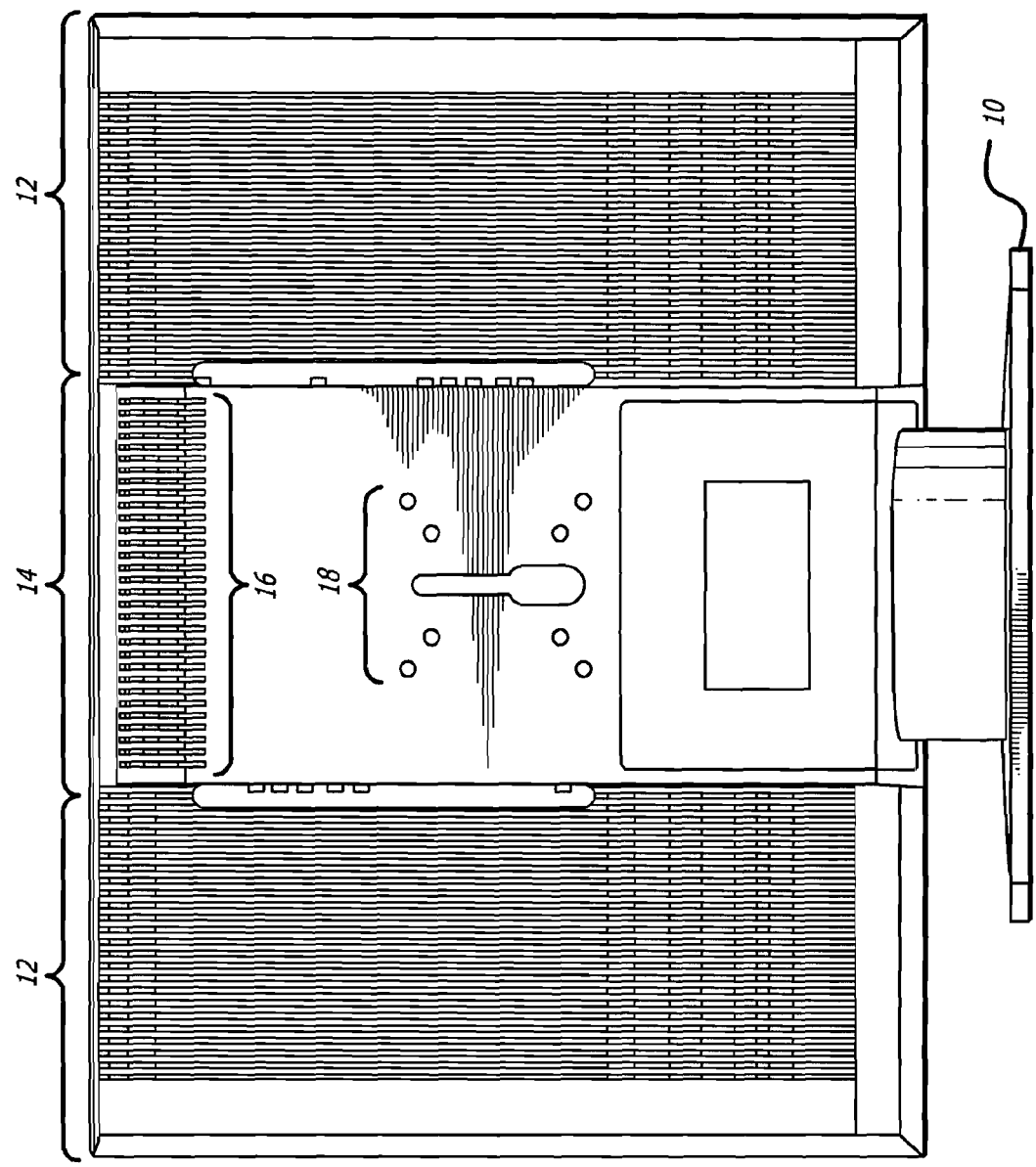
FIG. 1 is a depiction of the flat panel display of the invention from the back.

Referring first to FIG. 1, the back of a flat panel display is depicted. A base 10 may or may not be attached to a display. As is common in the art, the display may be used freestanding or hung on a wall. The base 10 is shown, for purposes of example, attached in this figure. Notably, the base 10 is attached only to the spine 14 of the television. In the preferred method of this invention a single connector type will be needed to attach a base 10 to any size of television using the spine 14. There are standardized connectors enclosed within the spine 14 which may be attached to multiple bases. Side panels 12 are very thin, front to back. In the preferred embodiment, the side panels 12 are only thick enough to provide a housing for the display. There are also cooling vents in the side panels 12 situated at the top and near the bottom. Liquid crystal displays do not generate much heat, nor do plasma display technology. However, the main controller board and electronics involved in any digital display do generate a substantial amount of heat. Therefore these vents are used in the display to enable the display electronics to properly ventilate.

Next, in element 14, the "spine" of the display is depicted. In the preferred embodiment, the spine is reinforced with U-shaped braces on the inside of the right and left of the spine. In the preferred embodiment there are multiple sets of two U-shaped braces wherein the U's face each other. These braces face each other and reinforce the spine in the preferred embodiment so that the spine may be used as the mounting point when mounting the display on a wall. These braces help serve to reinforce the spine of the display for supporting the entire weight of the display while wall-mounted or mounted to the base 10. The standardized mounting fixtures for use mounting the display to a wall-mount or other mounting are depicted in element 18.

Contained within the spine 14 are the electronics and power supply which control and power the display. These are arranged vertically and as thinly as possible. However, this spine section is designed, in the preferred embodiment, to be thick enough to support the weight, either wall-mounted or using the stand, of the display and to house these electronics. So, this spine is somewhat thicker than the side panels 12 in the preferred embodiment. The connectors to sound, video in, video out, and power are also housed within this spine 14, so the spine must be at least thick enough to allow for connection of these cables to the display.

Because the electronics and power supply of the display create the most heat, there is also another cooling vent 16 in the upper portion of the spine 14 in the preferred embodiment. Also in the preferred embodiment, the electronics, in particular the controller or main board, are housed in the upper portion of the spine, along with the electronics required to utilize each connector. The power supply is housed in the lower portion of the spine in the preferred embodiment. The main board generates more heat than the power supply. Therefore, this cooling vent 16 is closest to the largest source of heat for the display.

Finally, also depicted in this figure are the mounting fixtures 18. These fixtures, reinforced in the preferred embodiment with metal or plastic may be used to mount the display on a wall. The mounting fixtures 18 are capable of sustaining the entire weight of the display while wall-mounted. The reinforcement in the preferred embodiment of the spine, using the opposing U braces helps to enable this thin portion of the display back panel to sustain the weight of the entire display.

Figure 2:
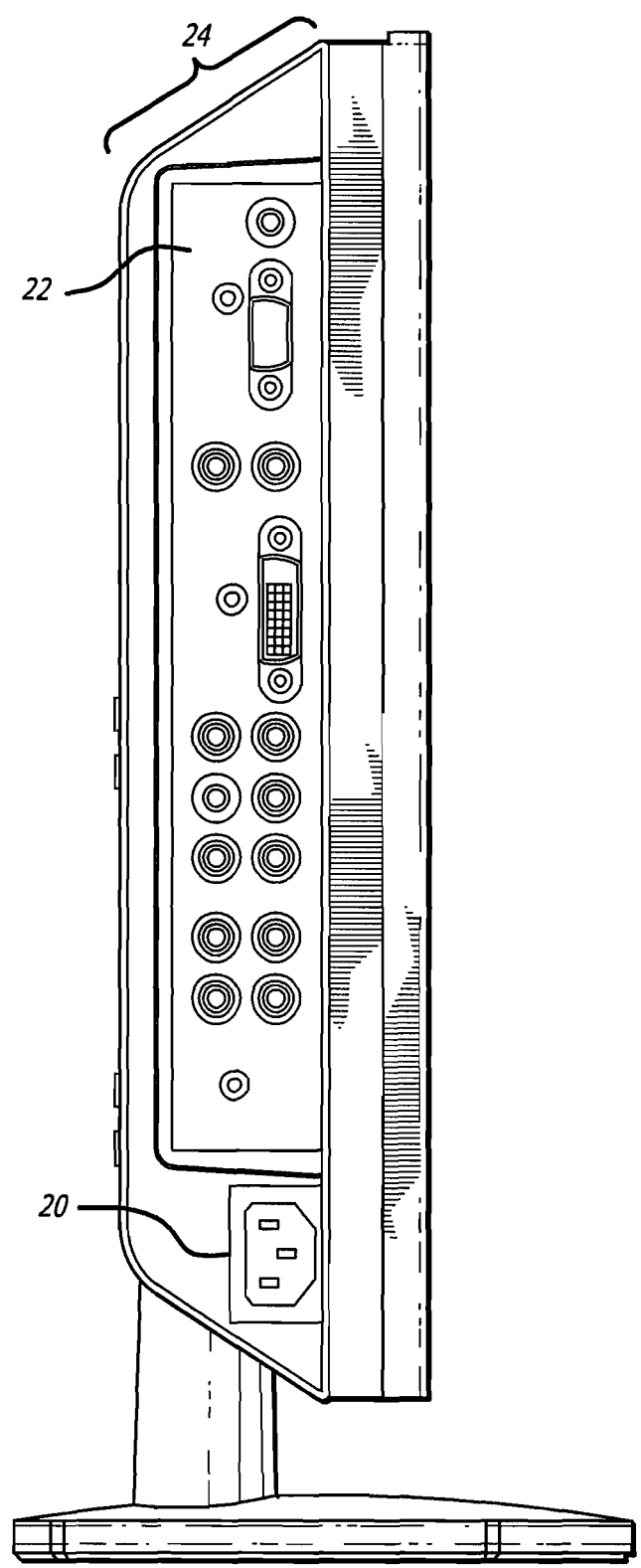
FIG. 2 is a depiction of the flat panel display of the invention from the side.

Referring now to FIG. 2, a side view of the flat panel display is depicted. In this figure, the side panel connectors are more clearly depicted. First, the base 10 is depicted again, from the side. As can be seen, the base 10 is sufficiently wide and deep so as to support the display. In cases of larger displays, the base 10 may be wider and deeper to support additional weight. In the preferred embodiment of the invention, the base 10 is removable through the operation of simple plastic "snap in" and "snap out" or in alternative embodiments, through the removal of screws or grommets. The base 10 of the preferred embodiment is an improvement over the prior art. As can be seen from FIG. 2, the base 10 extends further in front of the display than back behind the display. This is a result of the center mounted spine 14. The display has a lower center of gravity and more of the weight is shifted forward when more of the electronics are centered over the base 10. Therefore, the resulting display, with the base 10 extending further forward than backward, may be placed closer to a wall, even when using the base 10 to support the display.

The spine 14 is depicted from the side in element 14. As was seen in FIG. 1, the spine 14 is as narrow as possible, in relation to the width of the display, while still being wide enough to enclose all of the electronics and connections necessary to control and operate the display. In particular, as can be seen in element 22, room for the connector panel including relevant audio/visual connectors must be made. In the preferred embodiment, the depth of element 14 is roughly one inch. Also, in the preferred embodiment, there are connector panels 22 on either side of the spine. This will allow room for the connector panel 22 and all relevant audio/visual connectors, inputs and outputs. The connectors, inputs and outputs are standard in the industry and therefore, will not be described here. On television displays, coaxial cable connectors will be used and on computer displays, video inputs will be provided. These will be supplemented with digital and analog audio and visual input and output connectors. Finally, the power cable connector is depicted in element 20.

Each of the connectors depicted in element 22 and the power cable connected in element 20 are situated to the sides of the spine 14. On the side not depicted, additional connectors are situated with outward connections to the side. This is an improvement over the prior art in that the side connectors allow the display to be more closely situated near a wall. The unit may be more easily wall mounted when it is detached from the base 10 because there are no connectors protruding from the rear of the unit. The connectors are configured such that they face parallel to a wall, should the display be mounted upon the wall or be set stationary near a wall. This enables the total distance from the wall, if the unit is wall-mounted or near the wall to be only so far away as the spine 14 protrudes in the back of the display.

Additionally, the natural angle at which the audio, video and digital audio/visual connectors and coaxial cable connectors will "waterfall" when they are connected to the connectors 22 will be beneficial to limit signal impedance. In the prior art, cables are often crushed or pushed tightly against the wall because they are attached facing outward from the display. Because all connections are made facing outward and to the sides of the device, the display may be wall-mounted or situated near a wall while not "kinking" the cables. Therefore a higher-quality audio, visual or other signal will arrive at the mainboard for display.

Figure 3B:
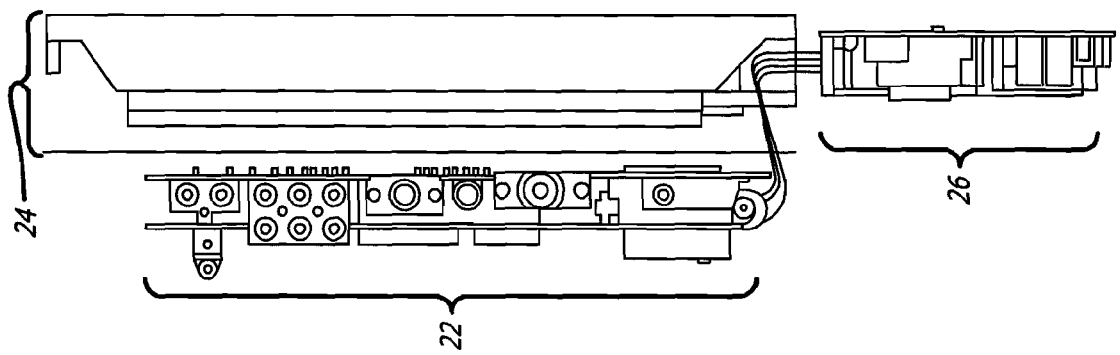
FIG. 3b is a depiction of the connectors on one side of the "spine" and the connectors placement with respect to the screen of the display.
Figure 3A:
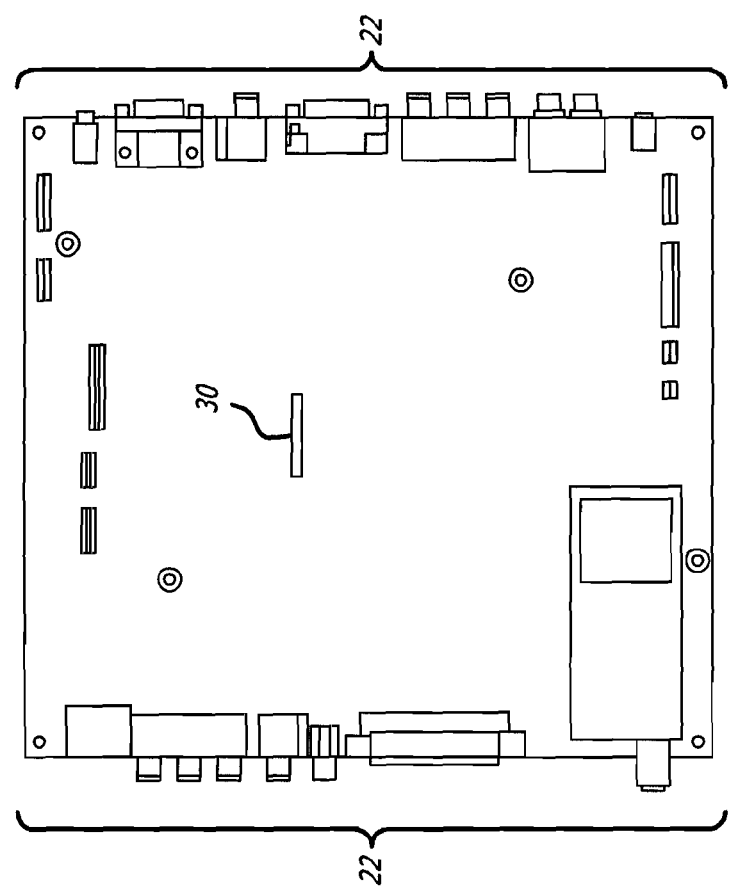
FIG. 3a is a depiction of the connectors on either side of the "spine."

Referring now to FIGS. 3a and 3b, depictions of the internal casing for the electronics and connectors are depicted. Connectors 22 are depicted in 3a and 3b, from the back view and from one side view. This portion of the invention will also contain all main board and control electronics. Also depicted is the LCD or plasma panel 24 of the display itself as shown in FIG. 3b. The diagram with the outer casing removed shows the relation between the connectors 22 and the display. They are as closely situated as possible within the preferred embodiment of invention. Also depicted in FIG. 3b is the power supply 26 of the invention, situated immediately below the mainboard and screen. Similarly, this is mounted so as to use as little space side-to-side as the main "spine" section of the display.

Still referring to FIGS. 3a and 3b, the single unit of the mainboard and the single power supply situated close to one another are advancements over the prior art. First, the mainboard, audio, visual and other components being combined into a single component is an advancement over the prior art. In the prior art, the audio subsystem would be situated at one place on the back of the display, connected to the mainboard via some wiring. The connectors 22 would be situated in different places or in one spot on the back, side or front of the display and were connected to the relevant subsystems using wiring. In the present invention the single component approach limits the amount of wiring used across the back of the display. The connections and each component is attached to a single piece. Additionally, in the prior art, multiple connections to the LCD or plasma panel were made. In the present invention, a single connection is used to connect the mainboard to the LCD or plasma panel. The back of this screen connection 30 is depicted in FIG. 3a.

Figure 4:
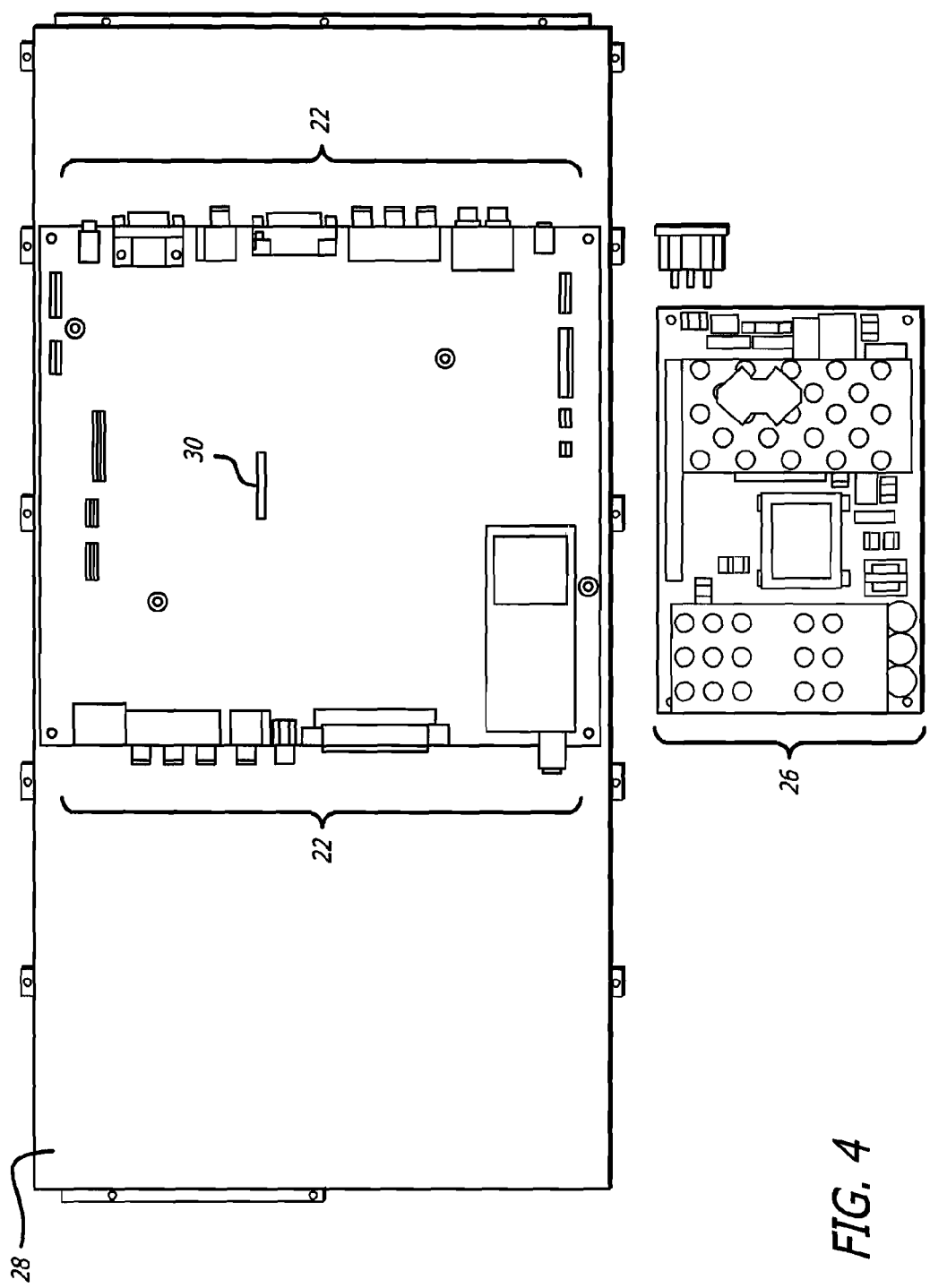
FIG. 4 is a depiction of the mounting of the "spine" on a screen backing.

Referring now to FIG. 4, the connectors 22, the power supply 26 and screen backing 28 are shown. The screen backing 28 is used to attach the spine 14 to the screen 24. One benefit of the present invention is the need for only minimal use of cabling outside of the spine 14. The invention connects directly, through a single panel connector 30, to the screen 24 in only one place. In the prior art, numerous connections were used, in various places throughout the backing of the panel 24, utilizing much more wiring and cabling. This is an advancement over the prior art in ease of manufacture and as a cost-saving and time-saving feature while the display is in production.

Additionally, in the prior art, shielding was used across the entire back of the panel to protect it from the heat generated from the numerous sub-components scattered across the back of the screen. Using the single component or spine of the present invention, heat-protective shielding need only be used where there are heat-generating components. Therefore, using the present invention, the panel need only be heat-shielded from the mainboard and power supply.

A further improvement of the present invention can also be demonstrated. The mainboard and power supply are created as a single component or two components. These components may be used on any size display, taking up effectively the same amount of space on any display. The mainboard and power supply of the spine of a typical display takes up substantially less space than the disparate and interconnected components attached across the back of a display in the prior art. Therefore, the present invention, by virtue of being a single or two connected components designed to be situated within the "spine" of a television take up considerably less space than those of the prior art. By virtue of this fact, they are cheaper to produce by using fewer components and less wiring. They are also more easily integrated into any television by virtue of being able to be standardized across multiple displays.

Figure 5:
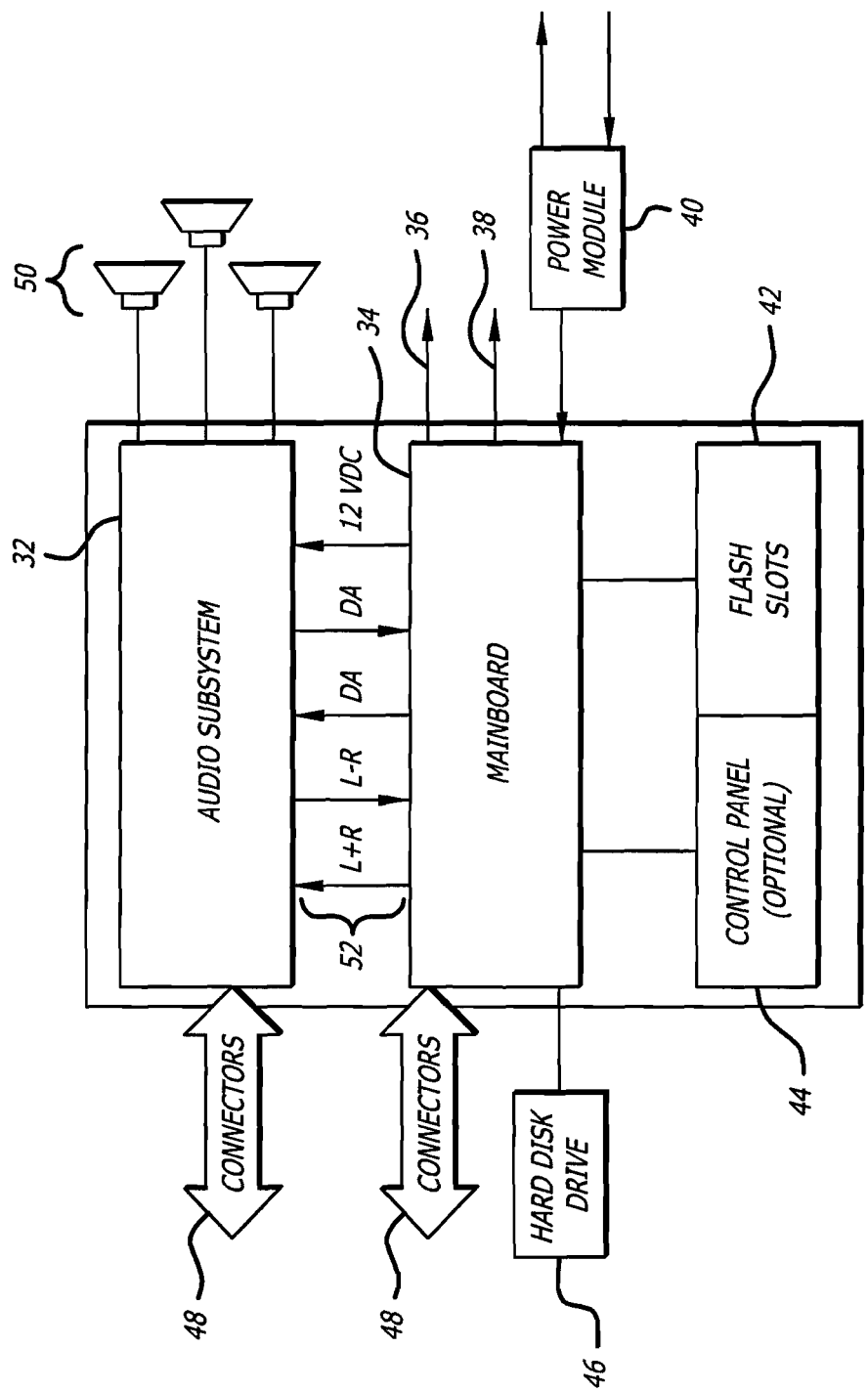
FIG. 5 is a block diagram of the mainboard used in the "spine" of the present invention.

Finally, referring to FIG. 5, a block diagram of some of the important portions of the spine mainboard are depicted. First, the audio subsystem 32 is depicted, along with connections directly (if included in the display itself) to speakers 50. This subsystem takes care of all audio input and output. It also decodes audio input for output to onboard or external speakers. This subsystem is connected to the mainboard 34 using numerous input, output and power connections. The mainboard 34 controls the LCD panel itself and is connected, as described, to the LCD panel using a single connection in the preferred embodiment. This single LCD panel connection is depicted in element 36. Additionally, in element 38, the mainboard 34 connection to the LCD panel for controlling the brightness and/or backlight of the screen is depicted.

The power module 46 is depicted with inputs and outputs for electricity and grounding in order to complete the circuit. Also depicted in the preferred embodiment are flash slots 42. These are used, in the preferred embodiment, to store software for the operation of the mainboard, audio subsystem and all additional components. In alternative embodiments, this flash memory may be upgradeable or "flashable." Flashable memory is memory that may be rewritten if the memory is first deleted then replaced with new data. It is common in the art to include flash memory for baseline computer operating procedures that may be upgraded or changed. Additionally, in alternative embodiments, there may be additional flash slots 42 for flash media containing content to be displayed on the display. Also depicted is an optional control panel 44 which may be accessed for manual configuration of the display. In the preferred embodiment, this houses the controls themselves and the electronics necessary to effectuate a particular change in the mainboard and the display. In alternative embodiments, this may also simply house the electronics necessary to effectuate changes on the display using a remote or front-mounted controls.

Also depicted is a hard disk drive 46. This may be used to store software for use in operating the display. Additionally or alternatively, content may be stored here for display on the device. Finally, connectors 38 to the mainboard 26 and to the audio subsystem 32 are depicted. These connectors are the same as the connectors depicted in element 22 in FIGS. 3a, 3b and 4. The mainboard 26 will have video and digital video connectors. The audio subsystem will have audio and digital audio connectors. Additional connectors 48 may also be present. The mainboard 26 in particular may be equipped with additional connectors including: universal serial bus (USB) connectors, flash memory input connectors and computer display connectors. Additional units may be affixed to the front of the display, providing for built-in DVD player capability. The "depth" provided in the center by the spine may be used to contain the required depth for the insertion of a Digital Video Disc.

Accordingly, an improved back panel for video display device has been disclosed. The invention, as described, is only the preferred embodiment. Many other embodiments of the invention may be described, without varying from the heart of the invention. The invention is limited only by the following claims.

What is claimed is:

1. A back panel of a visual display device comprising:
   a center housing;
   side housing panels on opposite respective sides of the center housing;
   wherein the center housing is thicker than the side housing panels and houses a controller, a power supply, and a connection for connecting the controller and the power supply to a visual display screen that is part of the visual display device;
   wherein the controller and the power supply are arranged vertically within the center housing, in a vertical direction from a bottom of the back panel to a top of the back panel;
   wherein the center housing has a width in a horizontal direction from a left side of the back panel to a right side of the back panel, that is at least one-third the width of the back panel; and
   wherein the width the center housing is greater than the combined widths of the side housing panels in the horizontal direction.

2. The back panel of claim 1, the side housing panels are symmetric about a vertical centerline of the display device.

3. The back panel of claim 1, wherein the center housing has a substantially flat back surface.

4. The back panel of claim 1, wherein the center housing has a width that is at least one third of the width of the back panel.

5. The back panel of claim 1, wherein the visual display screen comprises a flat-panel screen and wherein the back panel, in combination with the flat-panel screen, is operatively coupled to the controller, the power supply, and the connection, and mechanically coupled to the center housing and the side housing panels, the back panel and the flat-panel screen together constituting the visual display device.

6. The back panel of claim 1, wherein the visual display screen comprises a flat-panel screen, and wherein the back panel in combination with the flat-panel screen is operatively coupled to the controller, the power supply, and the connection, and mechanically coupled to the center housing and the side housing panels, the back panel and the flat-panel screen together constituting the visual display device.

7. The combination of claim 6, further comprising a base mechanically coupled to the visual display device, wherein the base extends further in front of the visual display device than behind the visual display device.

8. The back panel of claim 6, wherein the side housing panels are only thick enough to provide a housing for the flat-panel screen.

9. The back panel of claim 1, wherein the center housing includes mounting fixtures for mounting the display device to a wall mount.

10. The back panel of claim 1, wherein in a height of the center housing in the vertical direction is greater than the width of the center housing.

11. A back panel of a visual display device comprising:
    a center housing;
    side housing panels on opposite respective sides of the center housing;
    electronic elements for controlling the operation of the visual display device; and
    input connectors and output connectors for the visual display device;
    wherein the center housing is a raised center housing that is thicker than the side housing panels;
    wherein the center housing has a substantially flat back surface that is an external back surface for the visual display device;
    wherein substantially all of the electronic elements and the connectors are in the center housing;
    wherein the controller and the power supply are arranged vertically within the center housing, in a vertical direction from a bottom of the back panel to a top of the back panel; and
    wherein the center housing has a width in a horizontal direction from a left side of the back panel to a right side of the back panel, that is at least one-third the width of the back panel.

12. The back panel of claim 11, wherein the connectors face parallel to the back surface of the center housing.

13. The back panel of claim 11, wherein the side housing panels are symmetric about a vertical centerline of the display device.

14. The back panel of claim 11, wherein the electronic elements include a controller.

15. The back panel of claim 11, wherein the side housing panels each have a substantially constant thickness.

16. The back panel of claim 15, wherein the center housing has a substantially constant thickness.

17. The back panel of claim 11, wherein the center housing includes mounting fixtures for mounting the display device to a wall mount.

18. The back panel of claim 11, wherein the center housing has a width that is at least one third of the width of the back panel.

19. The back panel of claim 11, further comprising a power supply located within the center housing.

20. The back panel of claim 19, wherein the electronic elements and the power supply are arranged vertically within the center housing.

21. The back panel of claim 11, in combination with a flat-panel screen, operatively coupled to the electronic elements and the connectors, and mechanically coupled to the center housing and the side housing panels, the back panel and the flat-panel screen together constituting the visual display device.

22. The back panel of claim 21, wherein the side housing panels are only thick enough to provide a housing for the flat-panel screen.

* * * * *